(12) United States Patent
Behr

(10) Patent No.: US 10,546,048 B2
(45) Date of Patent: Jan. 28, 2020

(54) DYNAMIC CONTENT INTERFACE

(71) Applicant: Autodesk, Inc., San Rafael, CA (US)

(72) Inventor: Jay Allan Behr, San Francisco, CA (US)

(73) Assignee: AUTODESK, INC., San Rafael, CA (US)

( * ) Notice: Subject to any disclaimer, the term of this patent is extended or adjusted under 35 U.S.C. 154(b) by 931 days.

(21) Appl. No.: 14/946,353

(22) Filed: Nov. 19, 2015

(65) Prior Publication Data

US 2016/0147728 A1 May 26, 2016

Related U.S. Application Data

(60) Provisional application No. 62/085,173, filed on Nov. 26, 2014.

(51) Int. Cl.
| | | |
|---|---|---|
| *G06F 17/24* | (2006.01) | |
| *H04L 12/58* | (2006.01) | |
| *G06F 3/0484* | (2013.01) | |
| *G06F 3/0481* | (2013.01) | |
| *G06F 3/0482* | (2013.01) | |

(52) U.S. Cl.
CPC ............ *G06F 17/241* (2013.01); *H04L 51/10* (2013.01)

(58) Field of Classification Search
CPC ....... G06F 17/241; G06F 17/50; G06T 19/00; H04L 51/10
See application file for complete search history.

(56) References Cited

U.S. PATENT DOCUMENTS

| | | | | |
|---|---|---|---|---|
| 6,738,076 | B1* | 5/2004 | Mandavilli | G06F 3/04845 715/733 |
| 9,454,623 | B1* | 9/2016 | Kaptsan | G06F 17/50 |
| 2005/0091027 | A1* | 4/2005 | Zaher | G06F 17/2229 703/22 |
| 2011/0154243 | A1* | 6/2011 | Styga | G06F 3/04815 715/771 |
| 2013/0117376 | A1* | 5/2013 | Filman | G06F 17/2288 709/205 |
| 2013/0124967 | A1* | 5/2013 | Hatfield | H04L 51/16 715/232 |
| 2013/0145269 | A1* | 6/2013 | Latulipe | G06F 3/048 715/720 |
| 2014/0033068 | A1* | 1/2014 | Gupta | G06Q 10/103 715/751 |

* cited by examiner

*Primary Examiner* — Ryan F Pitaro
*Assistant Examiner* — Parmanand D Patel
(74) *Attorney, Agent, or Firm* — Gates & Cooper LLP

(57) ABSTRACT

A method, system, and computer program product provide the ability to dynamically collaborate on a design drawing. The design drawing consisting of three-dimensional (3D) data is acquired and displayed in a viewing area. An entity of the design drawing is graphically selected. A text comment is entered. The text comment and an association between the text comment and the selected entity are added to a design drawing file for the design drawing.

18 Claims, 11 Drawing Sheets

US 10,546,048 B2

DYNAMIC CONTENT INTERFACE

CROSS-REFERENCE TO RELATED APPLICATIONS

This application claims the benefit under 35 U.S.C. Section 119(e) of the following co-pending and commonly-assigned U.S. provisional patent application(s), which is/are incorporated by reference herein:

Provisional Application Serial No. 62/085,173, filed on Nov. 26, 2014, by Jay Allan Behr, entitled "Dynamic Content Interface".

BACKGROUND OF THE INVENTION

1. Field of the Invention.

The present invention relates generally to computer drawing files, and in particular, to a method, apparatus, system, and article of manufacture for enabling the commenting on drawing files.

2. Description of the Related Art.

Drawing files (e.g., computer-aided design files, solid modeling files, assembly files, two-dimensional [2D] and/or three-dimensional [3D] drawing files, etc.) are often static. When updates are required to such drawing files, there are two ways of indicating such updates: (1) making notes on a hard copy; (2) annotating a static electronic copy with leads to the comments. If another party wants to add any comments, they have to add such comments directly to the static drawing or sheet. Space and feedback are limited. Accordingly, there exists a need for dynamic feedback in drawing and assembly files. To better understand such problems, a description of prior art problems may be useful.

To provide feedback on a drawing, prior art users often mark up a printed copy of the drawing with a red pen. Such pen-based markups are nimble, fast, and allow a user to be very specific with feedback. Further, they allow the specification of feedback to specific elements in a drawing. A similar approach may be taken for commenting on electronic documents and/or in a network/electronic environment. For example, in most social collaboration products (e.g., the FACEBOOK™ social media application), one can comment on a post/photograph. Such a comment is against the entire file. Similar comments may be inserted against an entire drawing file (e.g., in a computer-aided design [CAD] drawing). However, user data may be deep and nested. A drawing file contains many sub parts that, in turn contain sub parts. Accordingly, commenting on the top level file (like in the FACEBOOK™ social media application) is not a very powerful way to collaborate. In addition, comments/feedback may become out of sync with the actual design almost immediately. Further, it is difficult to coordinate and reconcile feedback from multiple sources.

SUMMARY OF THE INVENTION

Embodiments of the invention solve the problem of static comments in 2D and 3D files. It allows users to collaborate and comment on a drawing or an assembly file in a dynamic way. A comment field is shown on the right side of a user interface, with a lead/leading line to the part or object relevant to the comment at the other end. Once a comment is created, other users are made aware and are able to add to the comment, respond, add files or other content. The comment is appended as necessary.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Hardware Environment

Figure 1:
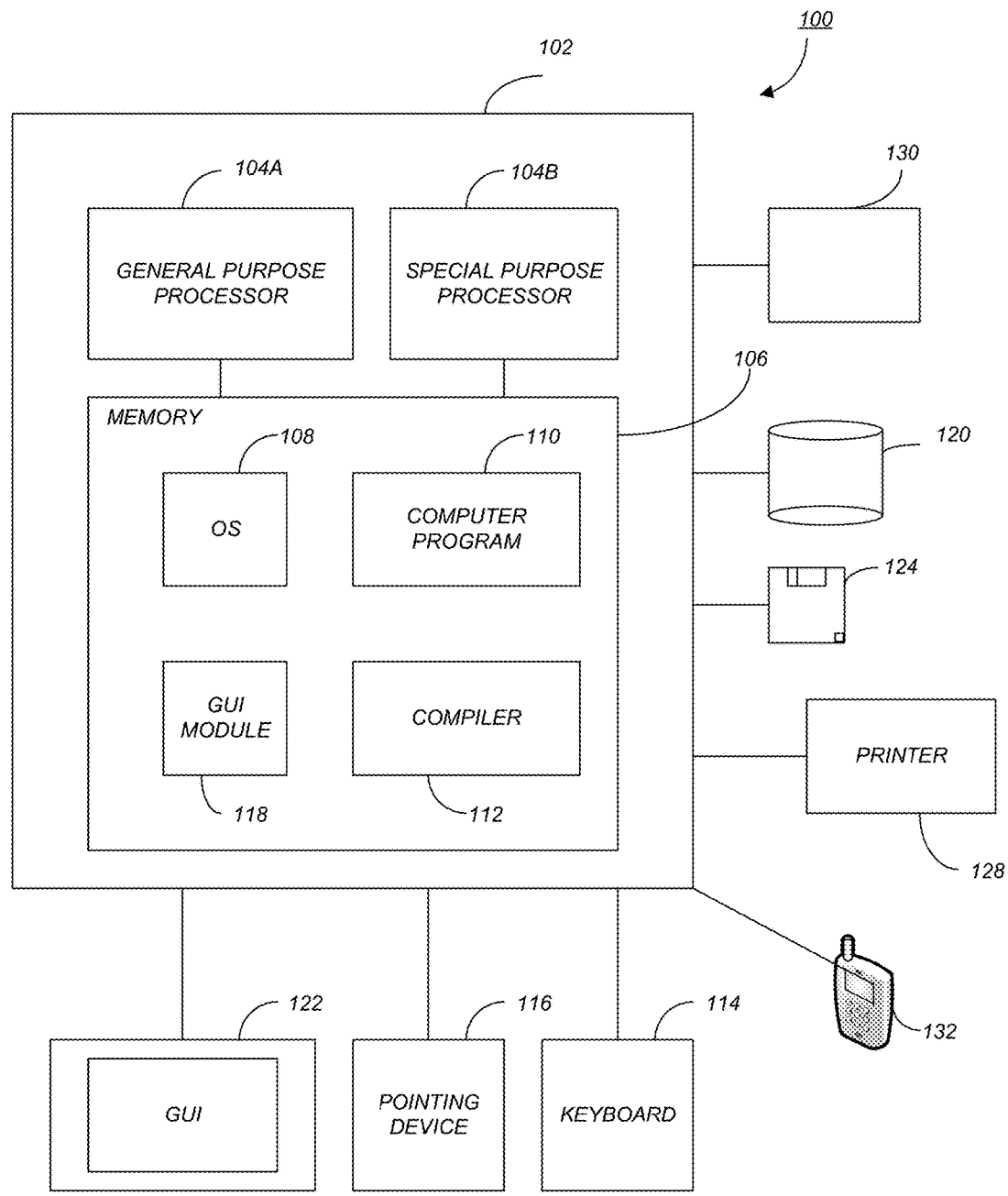
FIG. 1 is an exemplary hardware and software environment used to implement one or more embodiments of the invention.

FIG. 1 is an exemplary hardware and software environment 100 used to implement one or more embodiments of the invention. The hardware and software environment includes a computer 102 and may include peripherals. Computer 102 may be a user/client computer, server computer, or may be a database computer. The computer 102 comprises a general purpose hardware processor 104A and/or a special purpose hardware processor 104B (hereinafter alternatively collectively referred to as processor 104) and a memory 106, such as random access memory (RAM). The computer 102 may be coupled to, and/or integrated with, other devices, including input/output (I/O) devices such as a keyboard 114, a cursor control device 116 (e.g., a mouse, a pointing device, pen and tablet, touch screen, multi-touch device, etc.) and a printer 128. In one or more embodiments, computer 102 may be coupled to, or may comprise, a portable or media viewing/listening device 132 (e.g., an MP3 player, IPOD, NOOK, portable digital video player, cellular device, personal digital assistant, etc.). In yet another embodiment, the computer 102 may comprise a multi-touch device, mobile phone, gaming system, internet enabled television, television set top box, or other internet enabled device executing on various platforms and operating systems.

In one embodiment, the computer 102 operates by the general purpose processor 104A performing instructions defined by the computer program 110 under control of an operating system 108. The computer program 110 and/or the operating system 108 may be stored in the memory 106 and may interface with the user and/or other devices to accept input and commands and, based on such input and commands and the instructions defined by the computer program 110 and operating system 108, to provide output and results.

Output/results may be presented on the display 122 or provided to another device for presentation or further processing or action. In one embodiment, the display 122 comprises a liquid crystal display (LCD) having a plurality of separately addressable liquid crystals. Alternatively, the display 122 may comprise a light emitting diode (LED) display having clusters of red, green and blue diodes driven together to form full-color pixels. Each liquid crystal or pixel of the display 122 changes to an opaque or translucent state to form a part of the image on the display in response to the data or information generated by the processor 104 from the application of the instructions of the computer program 110 and/or operating system 108 to the input and commands. The image may be provided through a graphical user interface (GUI) module 118. Although the GUI module 118 is depicted as a separate module, the instructions performing the GUI functions can be resident or distributed in the operating system 108, the computer program 110, or implemented with special purpose memory and processors.

In one or more embodiments, the display 122 is integrated with/into the computer 102 and comprises a multi-touch device having a touch sensing surface (e.g., track pod or touch screen) with the ability to recognize the presence of two or more points of contact with the surface. Examples of multi-touch devices include mobile devices (e.g., IPHONE, NEXUS S, DROID devices, etc.), tablet computers (e.g., IPAD, HP TOUCHPAD), portable/handheld game/music/video player/console devices (e.g., IPOD TOUCH, MP3 players, NINTENDO 3DS, PLAYSTATION PORTABLE, etc.), touch tables, and walls (e.g., where an image is projected through acrylic and/or glass, and the image is then backlit with LEDs).

Some or all of the operations performed by the computer 102 according to the computer program 110 instructions may be implemented in a special purpose processor 104B. In this embodiment, the some or all of the computer program 110 instructions may be implemented via firmware instructions stored in a read only memory (ROM), a programmable read only memory (PROM) or flash memory within the special purpose processor 104B or in memory 106. The special purpose processor 104B may also be hardwired through circuit design to perform some or all of the operations to implement the present invention. Further, the special purpose processor 104B may be a hybrid processor, which includes dedicated circuitry for performing a subset of functions, and other circuits for performing more general functions such as responding to computer program 110 instructions. In one embodiment, the special purpose processor 104B is an application specific integrated circuit (ASIC).

The computer 102 may also implement a compiler 112 that allows an application or computer program 110 written in a programming language such as C, C++, Assembly, SQL, PYTHON, PROLOG, MATLAB, RUBY, RAILS, HASKELL, or other language to be translated into processor 104 readable code. Alternatively, the compiler 112 may be an interpreter that executes instructions/source code directly, translates source code into an intermediate representation that is executed, or that executes stored precompiled code. Such source code may be written in a variety of programming languages such as JAVA, JAVASCRIPT, PERL, BASIC, etc. After completion, the application or computer program 110 accesses and manipulates data accepted from I/O devices and stored in the memory 106 of the computer 102 using the relationships and logic that were generated using the compiler 112.

The computer 102 also optionally comprises an external communication device such as a modem, satellite link, Ethernet card, or other device for accepting input from, and providing output to, other computers 102.

In one embodiment, instructions implementing the operating system 108, the computer program 110, and the compiler 112 are tangibly embodied in a non-transitory computer-readable medium, e.g., data storage device 120, which could include one or more fixed or removable data storage devices, such as a zip drive, floppy disc drive 124, hard drive, CD-ROM drive, tape drive, etc. Further, the operating system 108 and the computer program 110 are comprised of computer program 110 instructions which, when accessed, read and executed by the computer 102, cause the computer 102 to perform the steps necessary to implement and/or use the present invention or to load the program of instructions into a memory 106, thus creating a special purpose data structure causing the computer 102 to operate as a specially programmed computer executing the method steps described herein. Computer program 110 and/or operating instructions may also be tangibly embodied in memory 106 and/or data communications devices 130, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 102.

Figure 2:
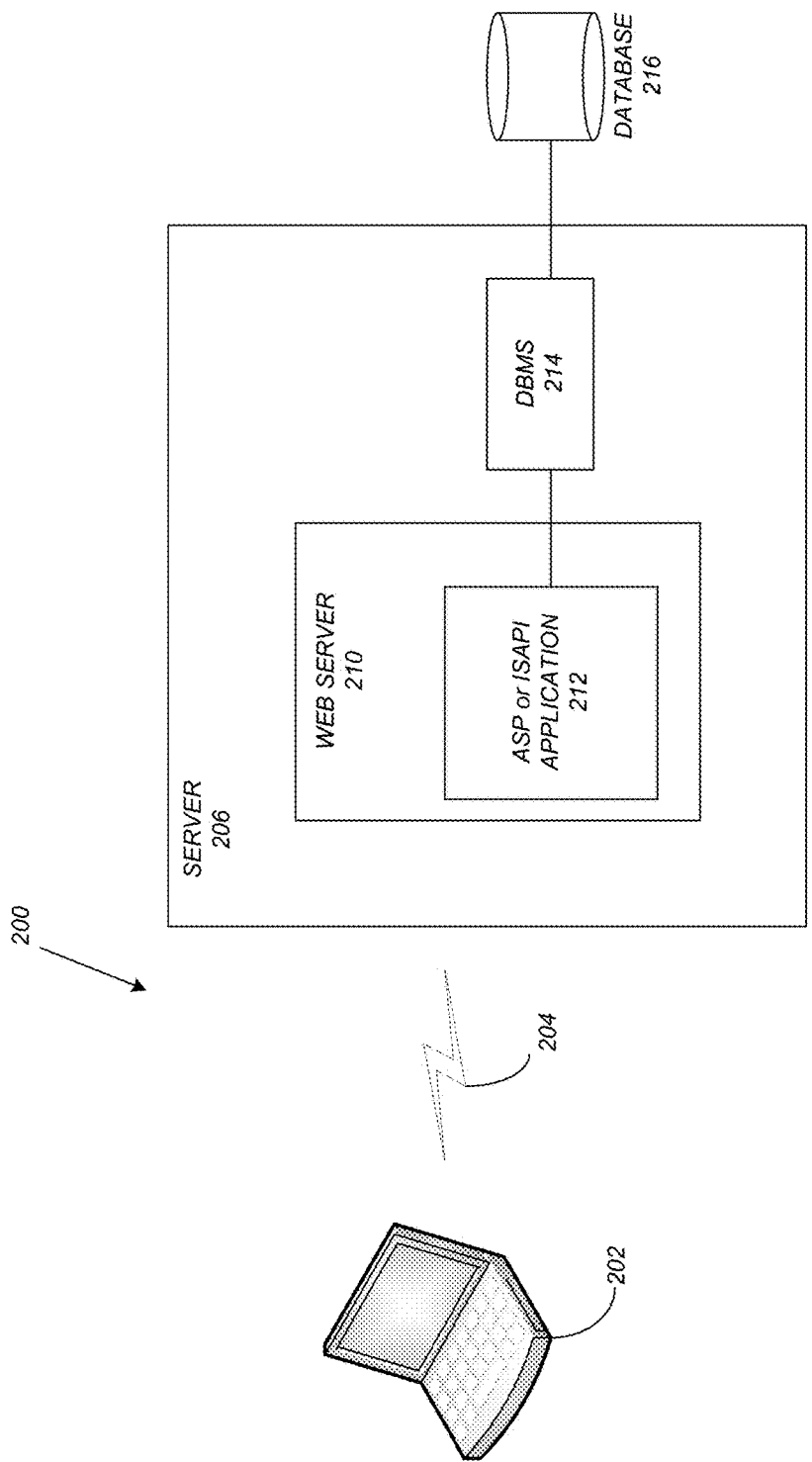
FIG. 2 schematically illustrates a typical distributed computer system using a network to connect client computers to server computers in accordance with one or more embodiments of the invention.

FIG. 2 schematically illustrates a typical distributed/cloud-based computer system 200 using a network 204 to connect client computers 202 to server computers 206. A typical combination of resources may include a network 204 comprising the Internet, LANs (local area networks), WANs (wide area networks), SNA (systems network architecture) networks, or the like, clients 202 that are personal computers or workstations (as set forth in FIG. 1), and servers 206 that are personal computers, workstations, minicomputers, or mainframes (as set forth in FIG. 1). However, it may be noted that different networks such as a cellular network (e.g., GSM [global system for mobile communications] or otherwise), a satellite based network, or any other type of network may be used to connect clients 202 and servers 206 in accordance with embodiments of the invention.

A network 204 such as the Internet connects clients 202 to server computers 206. Network 204 may utilize ethernet, coaxial cable, wireless communications, radio frequency (RF), etc. to connect and provide the communication between clients 202 and servers 206. Further, in a cloud-based computing system, resources (e.g., storage, processors, applications, memory, infrastructure, etc.) in clients 202 and server computers 206 may be shared by clients 202, server computers 206, and users across one or more networks. Resources may be shared by multiple users and can be dynamically reallocated per demand. In this regard, cloud computing may be referred to as a model for enabling access to a shared pool of configurable computing resources.

Clients 202 may execute a client application or web browser and communicate with server computers 206 executing web servers 210. Such a web browser is typically a program such as MICROSOFT INTERNET EXPLORER, MOZILLA FIREFOX, OPERA, APPLE SAFARI, GOOGLE CHROME, etc. Further, the software executing on clients 202 may be downloaded from server computer 206 to client computers 202 and installed as a plug-in or ACTIVEX control of a web browser. Accordingly, clients 202 may utilize ACTIVEX components/component object model (COM) or distributed COM (DCOM) components to provide a user interface on a display of client 202. The web server 210 is typically a program such as MICROSOFT'S INTERNET INFORMATION SERVER.

Web server 210 may host an Active Server Page (ASP) or Internet Server Application Programming Interface (ISAPI) application 212, which may be executing scripts. The scripts invoke objects that execute business logic (referred to as business objects). The business objects then manipulate data in database 216 through a database management system (DBMS) 214. Alternatively, database 216 may be part of, or connected directly to, client 202 instead of communicating/obtaining the information from database 216 across network 204. When a developer encapsulates the business functionality into objects, the system may be referred to as a component object model (COM) system. Accordingly, the scripts executing on web server 210 (and/or application 212) invoke COM objects that implement the business logic. Further, server 206 may utilize MICROSOFT'S TRANSACTION SERVER (MTS) to access required data stored in database 216 via an interface such as ADO (Active Data Objects), OLE DB (Object Linking and Embedding DataBase), or ODBC (Open DataBase Connectivity).

Generally, these components 200-216 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the terms "user computer", "client computer", and/or "server computer" are referred to herein, it is understood that such computers 202 and 206 may be interchangeable and may further include thin client devices with limited or full processing capabilities, portable devices such as cell phones, notebook computers, pocket computers, multi-touch devices, and/or any other devices with suitable processing, communication, and input/output capability.

Of course, those skilled in the art will recognize that any combination of the above components, or any number of different components, peripherals, and other devices, may be used with computers 202 and 206. Embodiments of the invention are implemented as a software application on a client 202 or server computer 206. Further, as described above, the client 202 or server computer 206 may comprise a thin client device or a portable device that has a multi-touch-based display.

Software Embodiment Overview

Embodiments of the invention (also referred to herein as "Commenting 2.0") provide for deep addressability, the ability to connect to an entity and/or a view of any design below the level of the file. In other words, deep addressability allows the user to attach data (e.g., feedback comment strings, mark-up sketches, etc.) to specific entities below the level of the file. Such entities may include objects and/or views. Object may include anything selectable, a face, edge, vertex, point, region, etc. Views may include camera orientation, visibility states, isolation settings, etc. Such capabilities allow the users to be more specific with less effort.

In the most basic use, deep addressability allows a user to attach a text string to a part/view. The comment architecture may include the following information about/for each inserted comment: the commenter, a timestamp, a status, addressee (e.g., item, sub-item, . . . , topological element, region, point, view, etc.), and content (e.g., text string, attachment, link, replies, etc.).

In addition, a comment's viability may be tested/carried over across versions. As the object may attach to a specific object, when the version of a file increments, it can easily be determined if any single piece of feedback/comment is still valid. In this regard, if attached to an object, a determination may be performed regarding whether the object still exists. If the object still exists, the feedback/comment may be carried forward to the new version. If the object no longer exists in the new version, the feedback/comment may be deleted or the user may be notified of the feedback/comment removal.

Deep Addressability Feedback/Comment Details

As described above, embodiments of the invention provide the ability to attach data such feedback comment strings and mark-up sketches) to specific entities below the level of the file. However, in addition, embodiments of the invention provide the following:

1—Data attachment in/on three-dimensional (3D) data;

2—Data (such as feedback comments) attachment to a view (e.g., camera position) of a 3D object. Such capability allows feedback to be attached against spatial conditions—for example the way physical things line up in a view or look from a specific angle.

3—Data (such as feedback comments) attachment to the presentation state of a two-dimensional (2D) or 3D design. Conceptually, one may view such a capability in terms of layers in a file. Feedback can be attached to a set of specific layer on-off states. Alternatively, data can be attached to states such as a building's visual appearance when it's experienced at 3:00 PM on the Summer solstice. In addition, embodiments of the invention let the user isolate visibility of a sub-part and make a comment that will re-isolate the part when a reader returns to view the comment.

4—Data (such as a visual sketch overlay image) attachment to a view and visibility state of a design. For example, using all of the above abilities, one can control the view of the 3D design that underlays 2D sketches above. For example, the 3D view below a 2D sketch of a model can be modified so that the 2D sketch above aligns to elements in 3D that are in the background in a specific way. In other words, 2D markup gets sketched over a specific 3D view—much like drawing on the glass of a window with a view of something aligned in the background. Such control enables mark-up commenting over a 2D and 3D view. For example, a 2D sketch may be addressed to the specific camera angle of the 3D subject behind.

5—Deep addressability commenting functionality wrapped in a project system (e.g., the A360™—AUTODESK A360™ cloud-based project collaboration tool/software) that enables the feedback parts to be managed and accessed at the level above the file. One can message activity around the data/feedback attached to a part.

For example, if a user marks a comment as "resolved", the right team members can be notified/messaged.

6—Targeted messaging of a comment to a specific user. A comment becomes a way back to the specific part or state of the design being commented on. For example, a team member can receive an email with a link that takes them not only to the file, but to the part of and state of a sub part in a design file in a project.

Graphical User Interface Details

Figure 3:
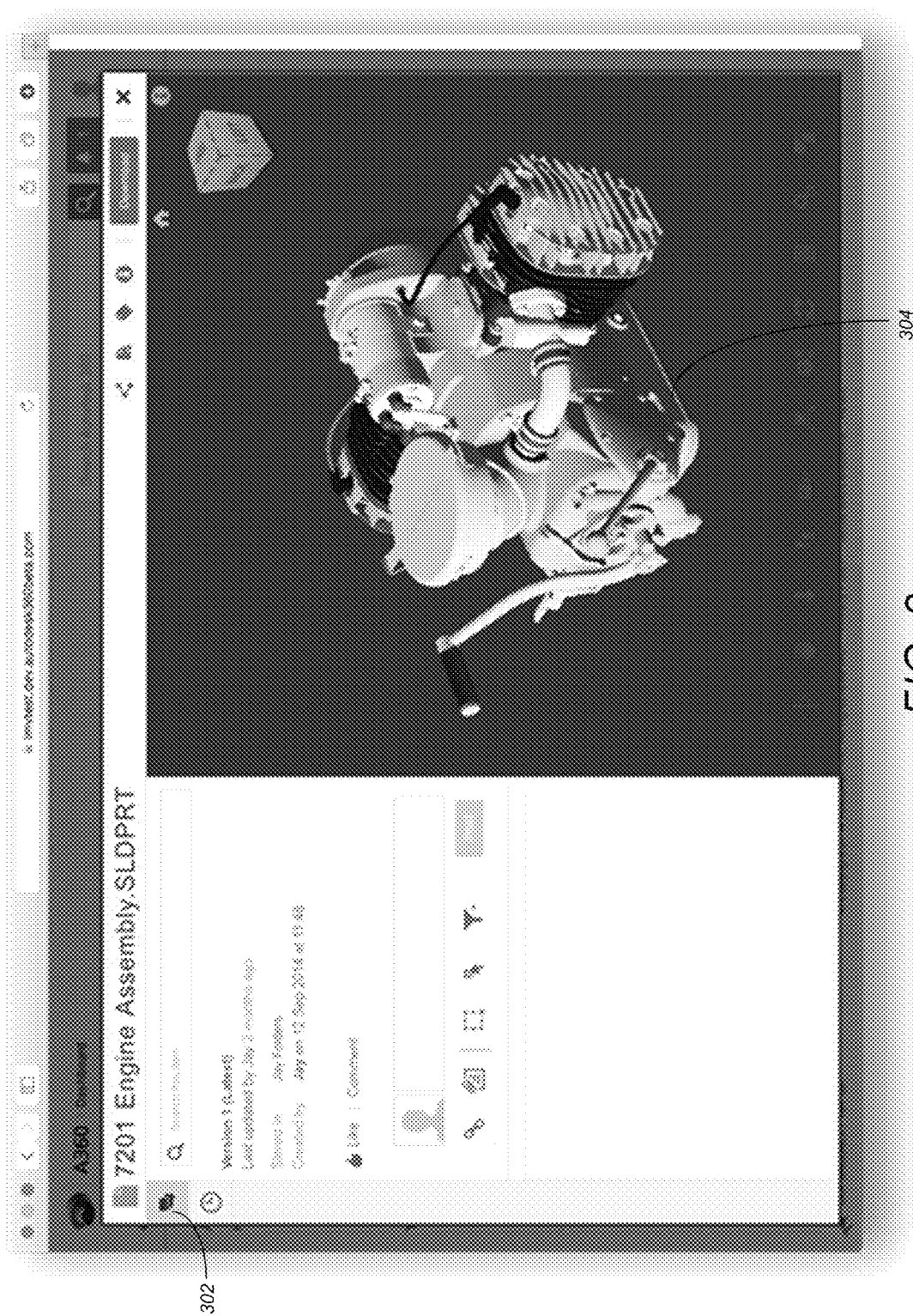
FIG. 3 illustrates the starting state of a graphical user interface with no comments yet in accordance with one or more embodiments of the invention.

FIG. 3 illustrates the starting state with no comments yet in accordance with one or more embodiments of the invention. In FIG. 3, the comment tab is indicated by icon 302. Further, the user has navigated to the design 304 that he/she desires to comment on. The user also has the option of adjusting the view of the design as needed. These view adjustments are stored with the comment. Accordingly, when a person later clicks the comment, the view changes to the way it was when the comment was made.

Figure 4:
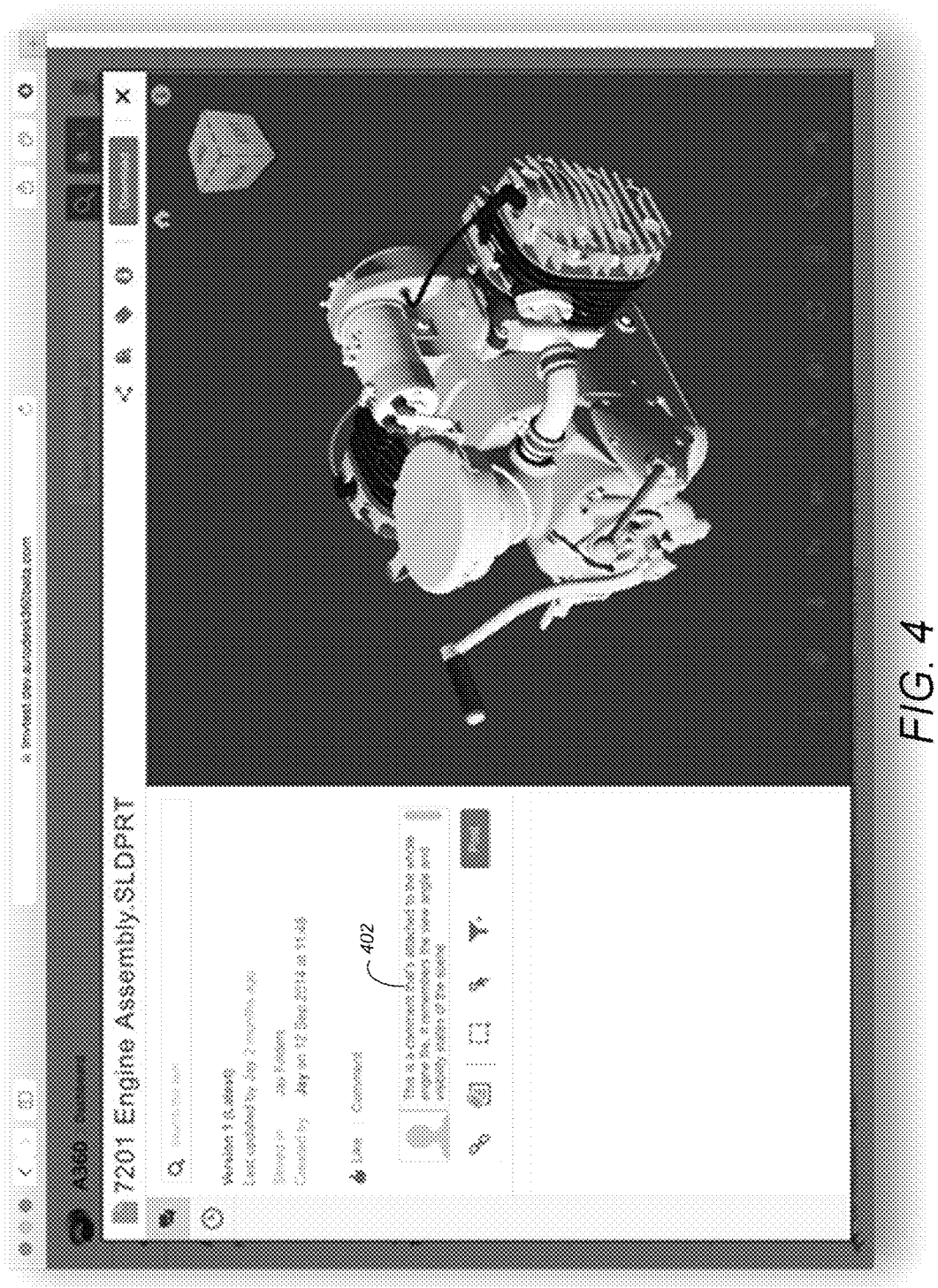
FIG. 4 illustrates a graphical user interface with a user making a comment against the whole file in accordance with one or more embodiments of the invention.

FIG. 4 illustrates a graphical user interface with a user making a comment against the whole file in accordance with one or more embodiments of the invention.

When viewing design files, different commenting options may be available. However, when viewing nondesign files and other items, the commenting capability may be limited to general comments. As illustrated in FIG. 4, the user is in the process of typing/entering the comment in area 402 but has not yet posted or saved the comment.

Figure 5:
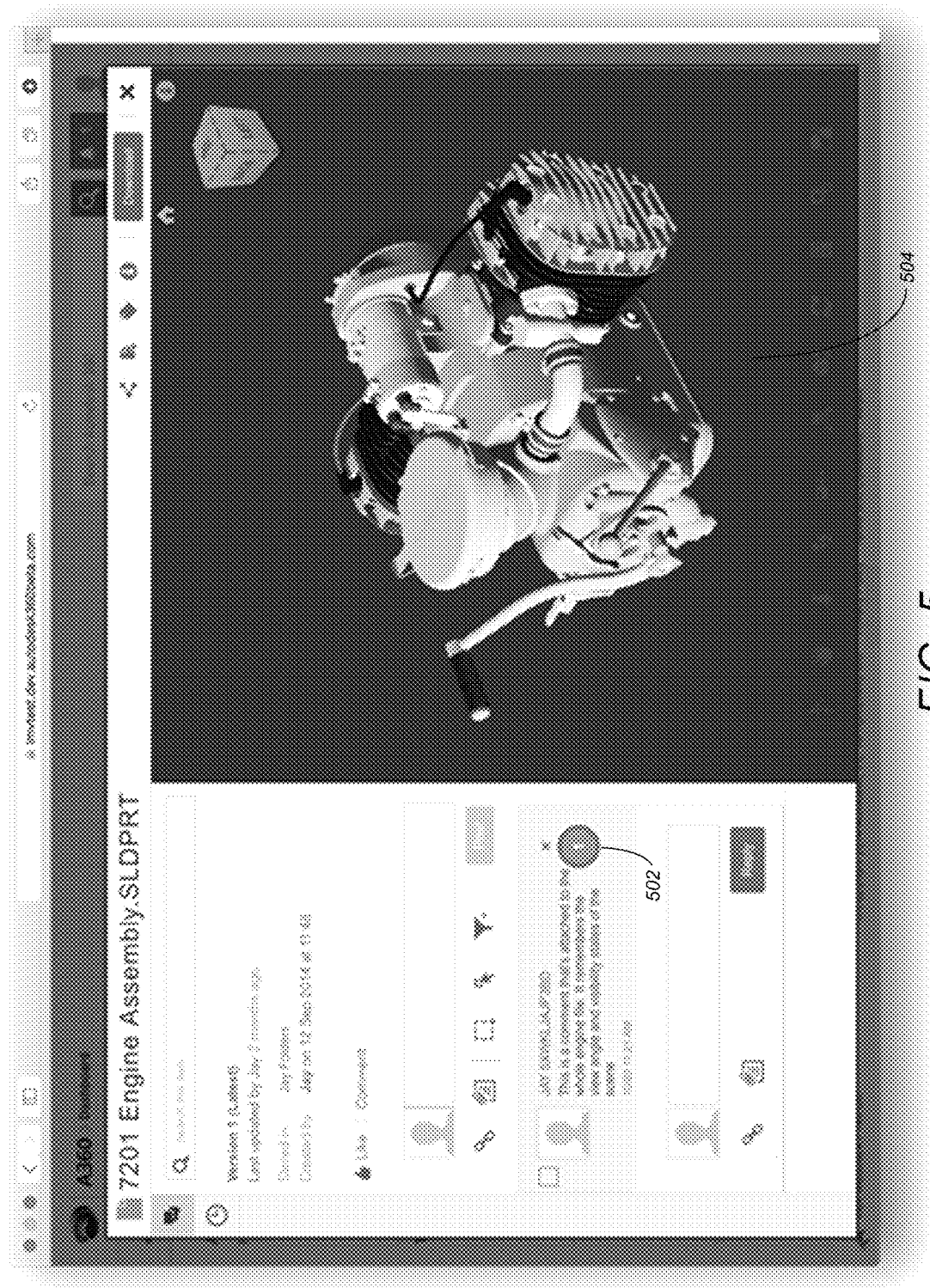
FIG. 5 illustrates a graphical user interface with a comment that has been created and selected in accordance with one or more embodiments of the invention.

FIG. 5 illustrates a graphical user interface where the comment of FIG. 4 has been created and selected in accordance with one or more embodiments of the invention. The comment consists of the following text "This is a comment that's attached to the whole engine file. It remembers the view angle and visibility states of the scene." As it is the first comment relating to the engine, it is identified with the number one (1) in a geometric shape (e.g., circle) 502. In this regard, each comment made on a design file may be numbered. Further, in some embodiments, the deletion of a comment may not restart the numbering. However, embodiments of the invention are not limited to numbers/numerical icons and any other type of identifier/icon/symbol (or no icon) may be used. As stated in the comment, the comment is attached to the whole engine file yet remembers the particular view angle and visibility states of the scene depicted in the model viewing area 504.

Figure 6:
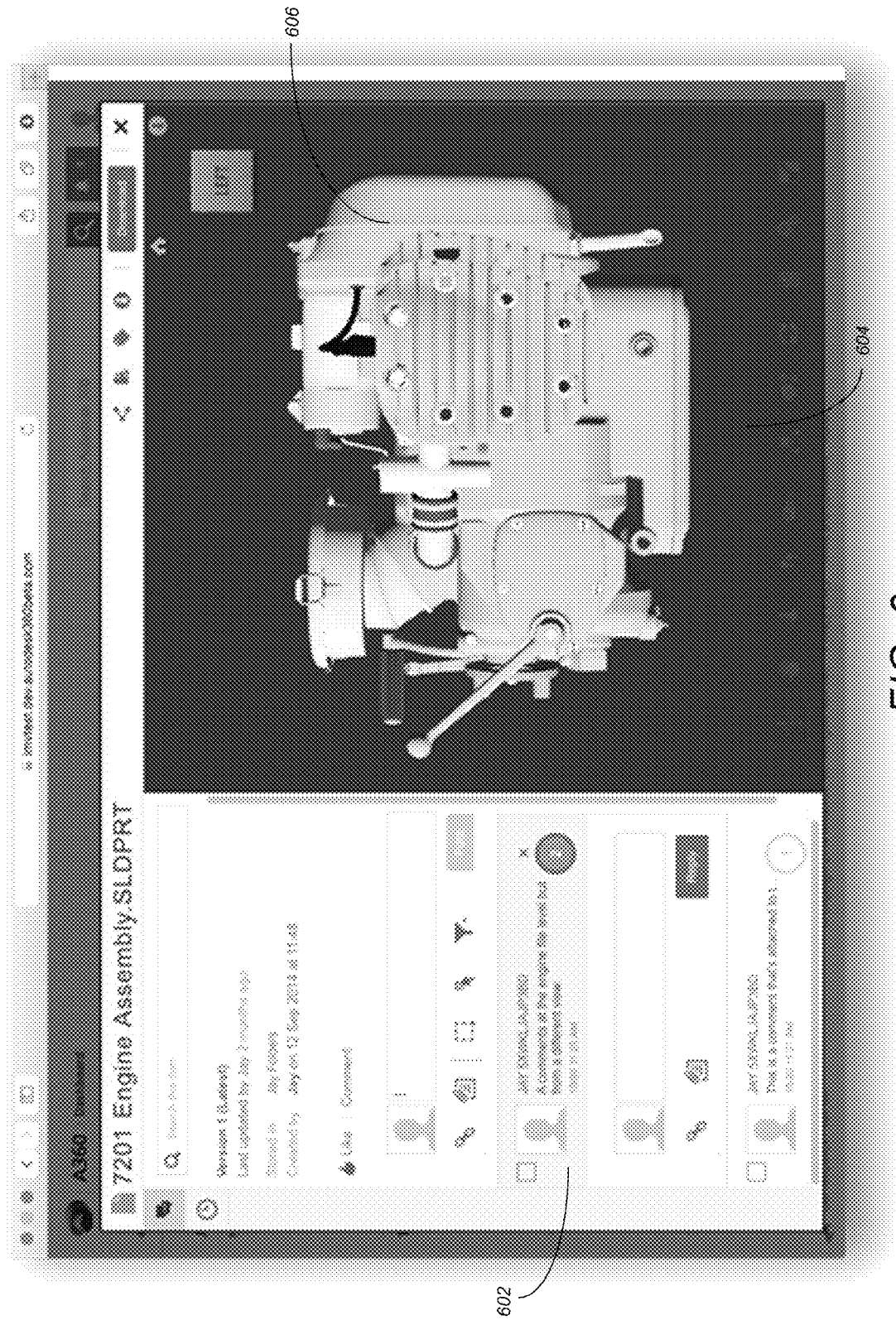
FIG. 6 illustrates a graphical user interface with a change in the camera position and creation of another comment in accordance with one or more embodiments of the invention.

FIG. 6 illustrates a graphical user interface with a change in the camera position and creation of another comment in accordance with one or more embodiments of the invention. As illustrated, the user had adjusted the view of the design 606 and has elected to insert a new comment. The new comment 602 is represented by the number two (2) in the circle. This second comment includes the text "A comments at the engine file level but from a different view". In other words, similar to comment 1 502, comment 2 602 is at the engine file level, but is from a different view (i.e., particular view angle and visibility states of the model in area 604 are stored with the comment 602). When the user returns and makes comment 2 602 active (e.g., selects/clicks comment 2 602), the model 606 will show the view from exactly this point. If objects (in the model 606) were made invisible when the comment 602 was made, such objects would also be returned to that state. Accordingly, the viewpoint, object state, and/or other element/object properties/attributes are stored/associated with a particular comment.

Figure 7:
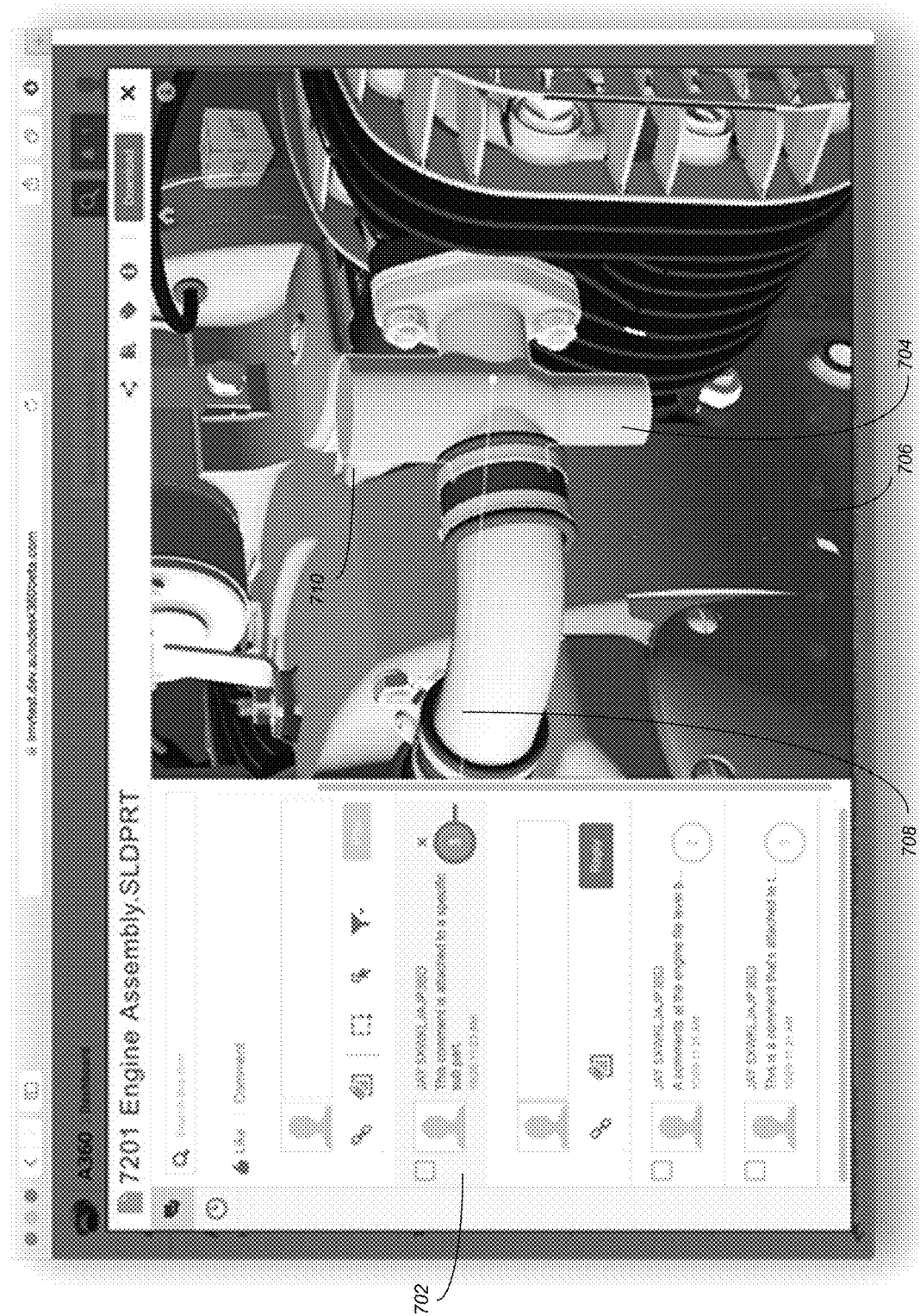
FIG. 7 illustrates a graphical user interface where a user has selected a part and attached a comment to a sub part in accordance with one or more embodiments of the invention.

FIG. 7 illustrates a graphical user interface where a user has selected a part/subpart and attached a comment to the part/subpart in accordance with one or more embodiments of the invention. More specifically, the user has selected part 704, and inserted comment three (3) 702. Once comment 3 702 has been inserted, a returning viewer not only sees the model from the view angle and state visibility (within viewing area 706), but also a leading line 708 and white outline 710 (or any other color line) making clear what part the comment 702 refers to. In other words, a leading line 708 from the comment to an outline of the part that the comment is directed to is displayed.

Figure 8:
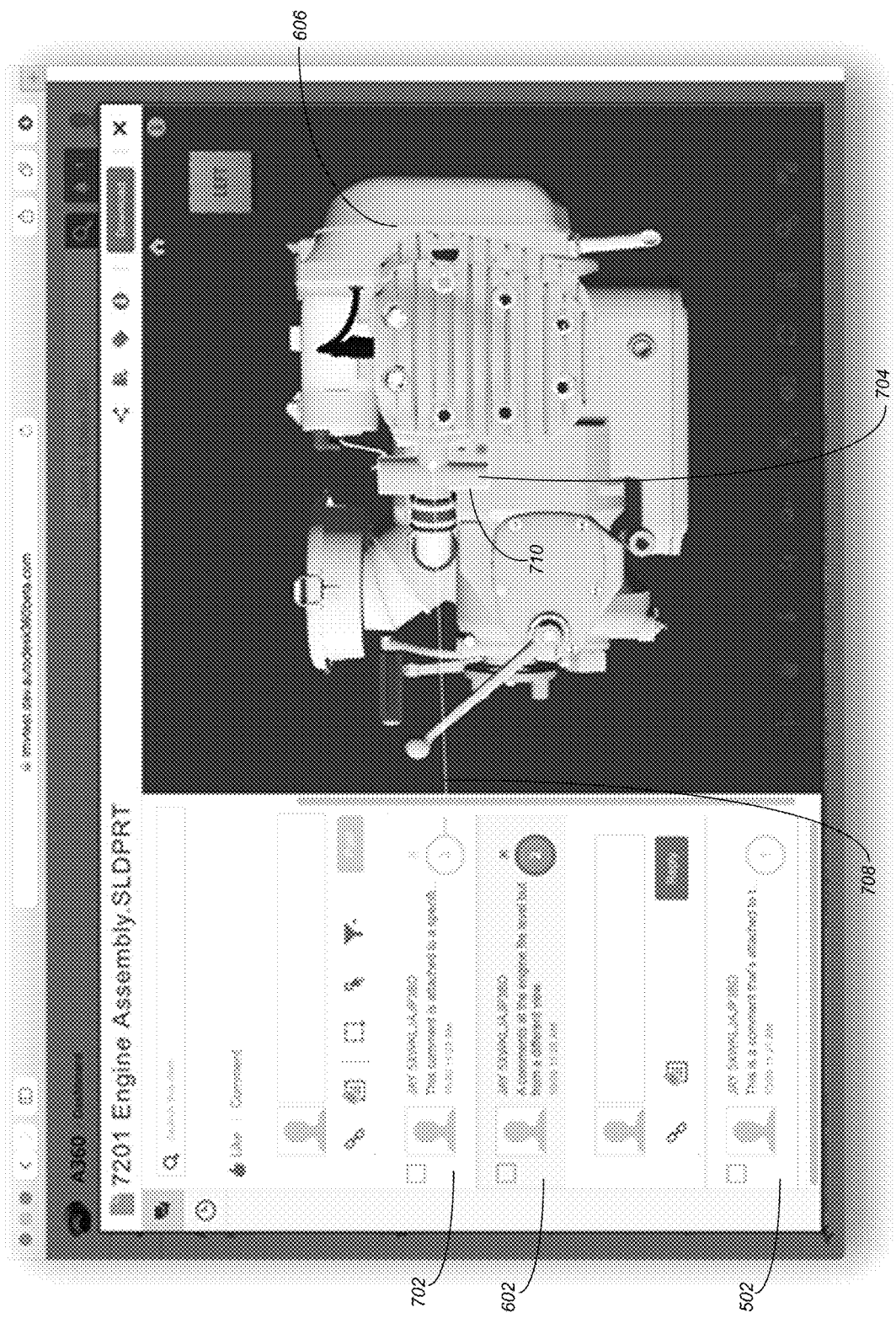
FIG. 8 illustrates a graphical user interface demonstrating that when another comment is active, rolling over a different comment attached to a sub-part previews the part the rolled over comment refers to, in accordance with one or more embodiments of the invention.

FIG. 8 illustrates a graphical user interface demonstrating that when another comment is active, rolling over a different comment attached to a sub-part previews the part that the rolled over comment refers to, in accordance with one or more embodiments of the invention. In FIG. 8, comment 2 602 is active as it is has been selected by a user. The user has moved the cursor (e.g., hovered) over comment 3 702. As a result, the screen previews the part 704 that comment 3 702 refers to. In other words, within the orientation/view associated with comment 2 602, the preview capability highlights/displays a preview or visual indication of the part 704 that comment 3 702 refers to (e.g., the leading line 708 and outline 710 associated with comment 3 702). If the part 704 is hidden by the current view of the model 606, an outline or an indication of the location of the part may be temporarily displayed.

Figure 9:
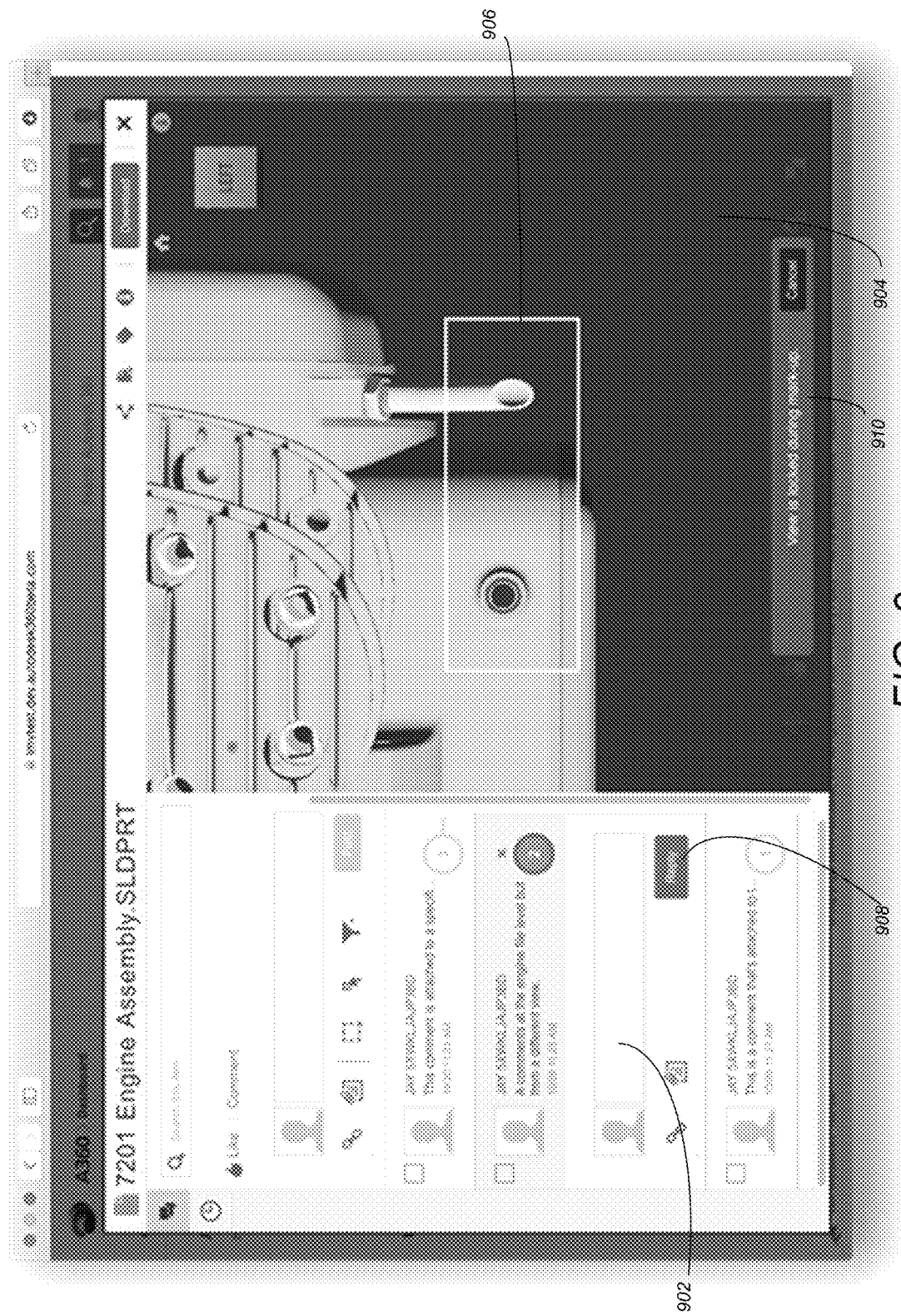
FIG. 9 illustrates a graphical user interface where the user can set a view angle and draw on the screen (mark-up) in accordance with one or more embodiments of the invention.

FIG. 9 illustrates a graphical user interface where the user can set a view angle and draw on the screen (mark-up) to insert a comment in accordance with one or more embodiments of the invention. In particular, the user may first zoom-in to a particular location of the model in viewing area 904 (e.g., adjust the view of the design as needed). Thereafter, upon selecting a comment type to draw a rectangle (e.g., select an image area of the model), the user draws rectangle 906. During/when drawing/marking-up, the view may be locked as indicated by warning message 910. Once the in-design markup/drawing (e.g., box 906 and/or other markup) is complete, the user can type the remark in comment box 902 and hit the "Reply" button 908 to add the comment to the comment string.

When the comment is returned to (e.g., via selection or clicking), the view angle and the visibility state are reset to the state associated with the comment and the marks (here just one rectangle) is overlaid and aligned to the view.

In view of the above, when a comment is inserted into a drawing, the view angle, visibility state of the objects in the viewing area, a link/association of the comment to a particular part/sub-part, and other relevant properties/attributes may be stored (e.g., with the comment and/or in a table/index).

Logical Flow

Figure 10:
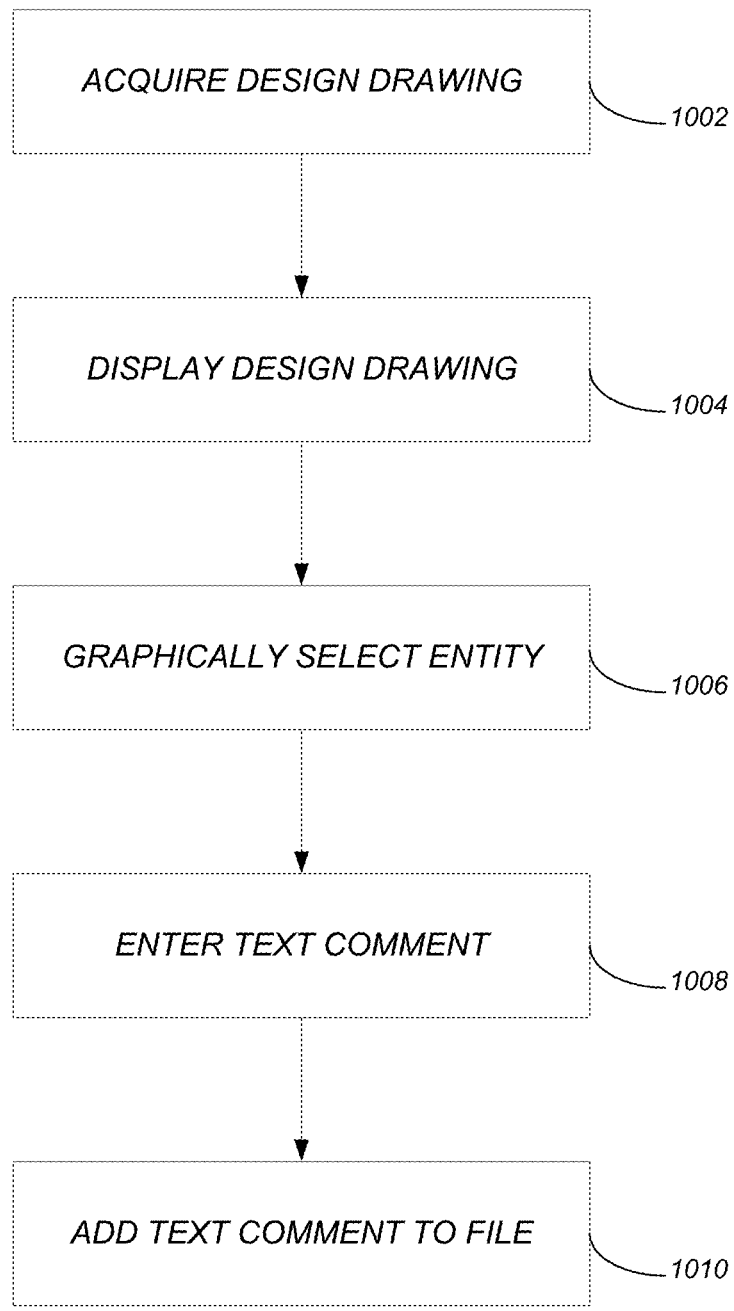
FIG. 10 is a flow chart illustrating the logical flow for dynamically collaborating on a design drawing in accordance with one or more embodiments of the invention.

FIG. 10 is a flow chart illustrating the logical flow for dynamically collaborating on a design drawing in accordance with one or more embodiments of the invention.

At step 1002, the design drawing is acquired. The design drawing consists of 3D data.

At step 1004, the design drawing is displayed in a viewing area (e.g., as illustrated in FIG. 3). In one or more embodiments, the view (e.g., camera position/angle) of the design drawing may be adjusted and/or captured. Once a view is captured, settings (e.g., the view angle, zoom level, etc.) associated with such with the captured view may be saved (e.g., with/attached to the text comment). Such settings may later be retrieved (e.g., upon selection of the comment) and used to reset the viewing area to display the design drawing back to the (captured) view based on the settings.

Figure 11:
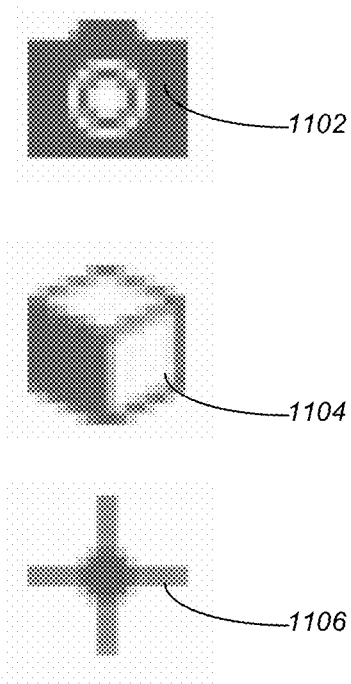
FIG. 11 illustrates exemplary icons that are selectable to identify the desired comment type in accordance with one or more embodiments of the invention.

At step 1006, an entity (including a sub-entity) of the design drawing is graphically selected. Various options may be available to select the entity. In one or more embodiments, the user has the option to select the type of comment that he/she desires to make. The different comment types may be represented by different icons displayed in a comment tab. FIG. 11 illustrates exemplary icons that are selectable to identify the desired comment type. Icon 1102 may be used to comment on a particular view. The user may select image/icon 1102 to capture an image of the currently displayed view. Any time before the user elects to proceed, the view can be recaptured until the user is satisfied. After capturing the image view, the user may select other comment types before proceeding. Further, once captured, as described above, the settings associated with the captured view are preserved/saved. To comment on a particular object within the design drawing, the user can select icon/image 1104 (representative of an object type comment). Thereafter, the cursor may change and allow the user to select the desired object in the design drawing. For a comment on a particular point, the user may select the point icon/image 1106 (representative of a point type comment), followed by the selection of the desired point in the design drawing.

In view of the above, the graphic selection of the entity may also include the defining of a presentation state of the design drawing. Such a presentation state may consist of on-off states for elements/objects of the design drawing. The presentation state may also be associated with/attached to the comment such that upon later selection of the comment, the viewing area may be reset to display the design drawing based on the presentation state.

The entity that is selected and the association between the selected entity and the text comment may be graphically represented by a leading line that connects the comment to the selected entity.

At step 1008, a text comment is entered.

At step 1010, the text comment (and an association with the selected entity) is added to a file for the design drawing. Such an addition of the text comment (and the association with the selected entity) to the design drawing file enables features that were not permissible in the prior art that merely attached a comment to an entire static design. For example, as described above, selection of the comment will reorient the display/view of the design drawing back to the state of the design drawing established when the comment was first made. Consequently, if the view has been changed, selection of the comment will reset the view. In addition, hovering a cursor over a text comment may highlight the selected entity that the text comment is associated with (without resetting the view of the design drawing).

Further to the above, the dynamic collaboration may be enabled on/via a cloud based project application. Such a cloud based project application provides access to a design drawing and the text comment to multiple collaborating users. To further enable and facilitate collaboration amongst users, in response to the addition of the text comment, a message (e.g., an email, text, or other electronic message) may be targeted to one or more of the multiple collaborating users. Such a message includes a link to the design drawing file and the selected entity that the comment is associated with. Accordingly, a team member can receive an email with a link that takes them not only to the design drawing file, but to the selected entity/part and state of a subpart in the design file in a project. Thus, once a comment is created, other users are made aware of the comment, and are able to add to the comment, respond, add files or other content to the comment, etc.

CONCLUSION

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A computer-implemented method for dynamically collaborating on a design drawing, comprising:
   acquiring the design drawing, wherein the design drawing comprises three-dimensional (3D) data;
   displaying the design drawing in a viewing area;
   graphically selecting an entity of the design drawing;
   entering a text comment;
   capturing a camera view of the design drawing, wherein the camera view comprises a position and angle of the design drawing when the text comment was entered;
   adding the text comment and an association between the text comment and the selected entity, to a design drawing file for the design drawing;
   attaching settings for the camera view to the text comment;
   saving the text comment, the association and the attached settings; and
   upon later selecting the text comment resetting the viewing area to display the design drawing to the camera view based on the saved attached settings.

2. The computer-implemented method of claim 1, further comprising:
   adjusting a view of the design drawing subsequent to saving the text comment, the association, and the attached settings; and
   wherein upon the later selecting the comment, the viewing area is reset to display the design drawing to the view based on the saved attached settings.

3. The computer-implemented method of claim 1, wherein the graphically selecting the entity comprises:
   defining a presentation state of the design drawing, wherein the presentation state comprises on-off states for elements of the design drawing, and wherein the presentation specifies a visual appearance of the 3D data in the design drawing;
   attaching the presentation state to the comment; and
   upon later selecting the comment, resetting the viewing area to display the design drawing based on the presentation state.

4. The computer-implemented method of claim 1, further comprising:
   adjusting a view of the design drawing;
   hovering a cursor over the text comment;
   in response to the hovering, highlighting the selected entity that the text comment is associated with without resetting the view of the design drawing.

5. The computer-implemented method of claim 1, wherein the graphically selecting the entity comprises:

selecting an option for an object type comment; and
selecting an object in the design drawing in the viewing area.

6. The computer-implemented method of claim 1, wherein the graphically selecting the entity comprises:
selecting an option for a point type comment; and
selecting a point in the design drawing in the viewing area.

7. The computer-implemented method of claim 1, further comprising:
displaying a leading line from the text comment to the selected entity associated with the text comment.

8. The computer-implemented method of claim 1, further comprising:
enabling the dynamic collaborating on a cloud based project application; and
providing access to the design drawing and text comment to multiple collaborating users via the cloud based project application.

9. The computer-implemented method of claim 8, further comprising:
in response to the adding of the text comment, targeting a message to one or more of the multiple collaborating users, wherein the message comprises a link to the design drawing file and the selected entity that the comment is associated with.

10. A computer system for dynamically collaborating on a design drawing comprising:
(a) a computer having a memory;
(b) an cloud based project application executing on the computer, wherein the cloud based project application is configured to:
(1) acquire the design drawing, wherein the design drawing comprises three-dimensional (3D) data;
(2) display the design drawing in a viewing area;
(3) graphically select an entity of the design drawing; and
(4) enter a text comment;
(5) capture a camera view of the design drawing, wherein the camera view comprises a position and angle of the design drawing when the text comment was entered
(6) add the text comment and an association between the text comment and the selected entity to a design drawing file for the design drawing;
(7) attach settings for the camera view to the text comment
(8) save the text, the association and the attached settings; and
(9) upon later selection of the text comment, reset the viewing area to display the design drawing to the camera view based on the saved attached settings.

11. The computer system of claim 10, wherein the cloud based project application is further configured to:
adjust a view of the design drawing subsequent to saving the text comment, the association, and the attached settings; and
wherein upon the later selection of the comment, the viewing area is reset to display the design drawing to the view based on the saved attached settings.

12. The computer system of claim 10, wherein the cloud based project application is configured to graphically select the entity by:
defining a presentation state of the design drawing, wherein the presentation state comprises on-off states for elements of the design drawing, and wherein the presentation specifies a visual appearance of the 3D data in the design drawing;
attaching the presentation state to the comment; and
upon later selecting the comment, resetting the viewing area to display the design drawing based on the presentation state.

13. The computer system of claim 10, wherein the cloud based project application is further configured to:
adjust a view of the design drawing;
hover a cursor over the text comment;
in response to the hover, highlight the selected entity that the text comment is associated with without resetting the view of the design drawing.

14. The computer system of claim 10, wherein the cloud based project application is configured to graphically select the entity by:
selecting an option for an object type comment; and
selecting an object in the design drawing in the viewing area.

15. The computer system of claim 10, wherein the cloud based project application is configured to graphically select the entity by:
selecting an option for a point type comment; and
selecting a point in the design drawing in the viewing area.

16. The computer system of claim 10, wherein the cloud based project application is further configured to:
display a leading line from the text comment to the selected entity associated with the text comment.

17. The computer system of claim 10, wherein the cloud based project application is further configured to:
provide access to the design drawing and text comment to multiple collaborating users.

18. The computer system of claim 17, wherein the cloud based project application is further configured to:
in response to the addition of the text comment, target a message to one or more of the multiple collaborating users, wherein the message comprises a link to the design drawing file and the selected entity that the comment is associated with.

* * * * *